United States Patent
Shimamoto et al.

(10) Patent No.: US 9,929,005 B1
(45) Date of Patent: Mar. 27, 2018

(54) METHOD OF MANUFACTURING SEMICONDUCTOR DEVICE

(71) Applicant: Hitachi Kokusai Electric Inc., Tokyo (JP)

(72) Inventors: Satoshi Shimamoto, Toyama (JP); Teruo Yoshino, Toyama (JP); Tadashi Terasaki, Toyama (JP); Masanori Nakayama, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 15/388,982

(22) Filed: Dec. 22, 2016

(30) Foreign Application Priority Data

Sep. 26, 2016 (JP) .................................. 2016-186956

(51) Int. Cl.
| | |
|---|---|
| *H01L 21/02* | (2006.01) |
| *C23C 16/455* | (2006.01) |
| *C23C 16/50* | (2006.01) |
| *C23C 16/40* | (2006.01) |

(52) U.S. Cl.
CPC ...... *H01L 21/02164* (2013.01); *C23C 16/401* (2013.01); *C23C 16/455* (2013.01); *C23C 16/50* (2013.01); *H01L 21/02274* (2013.01)

(58) Field of Classification Search
None
See application file for complete search history.

(56) References Cited

U.S. PATENT DOCUMENTS

| | | | |
|---|---|---|---|
| 6,992,019 B2 | 1/2006 | Lee et al. | |
| 2001/0027031 A1 | 10/2001 | Hasebe et al. | |
| 2003/0008528 A1* | 1/2003 | Xia | C23C 16/0218 438/787 |
| 2005/0196533 A1 | 9/2005 | Hasebe et al. | |
| 2006/0046508 A1* | 3/2006 | Nemani | C23C 16/401 438/758 |
| 2009/0047778 A1* | 2/2009 | Sasaki | H01J 37/32192 438/594 |
| 2010/0240217 A1* | 9/2010 | Kushibiki | H01L 21/0273 438/694 |
| 2011/0130011 A1 | 6/2011 | Sasajima et al. | |
| 2015/0126042 A1* | 5/2015 | Pasquale | H01L 21/02274 438/761 |

(Continued)

FOREIGN PATENT DOCUMENTS

| | | |
|---|---|---|
| JP | 1999067747 A | 3/1999 |
| JP | 2001338922 A | 12/2001 |

(Continued)

*Primary Examiner* — Abul Kalam
(74) *Attorney, Agent, or Firm* — Edell, Shapiro & Finnan, LLC

(57) ABSTRACT

Disclosed is a method of manufacturing a semiconductor device. The method includes: (a) accommodating a substrate having a plurality of carbon-containing films protruding from a surface of the substrate; (b) forming a silicon-containing film on a surface of the plurality of carbon-containing films and a surface of the substrate by supplying a silicon-containing gas to the substrate; (c) forming a silicon/oxygen-containing film by supplying a first plasma of an oxygen-containing gas to the substrate; and (d) forming a silicon oxide film by supplying a second plasma of the oxygen-containing gas to the substrate after performing (c).

7 Claims, 9 Drawing Sheets

(56) References Cited

U.S. PATENT DOCUMENTS

| | | | | |
|---|---|---|---|---|
| 2016/0020092 A1* | 1/2016 | Kang | ............... | H01L 21/02274 438/761 |
| 2016/0225639 A1* | 8/2016 | Kihara | .............. | H01L 21/02208 |
| 2016/0293418 A1* | 10/2016 | Pasquale | ........... | H01L 21/02274 |
| 2017/0076956 A1* | 3/2017 | Hirayama | ............. | C23C 16/509 |

FOREIGN PATENT DOCUMENTS

| JP | 2005123275 A | 5/2005 |
|---|---|---|
| JP | 2009021526 A | 1/2009 |
| JP | 2009188349 A | 8/2009 |
| JP | 1422445 A | 2/2010 |
| JP | 2011129877 A | 6/2011 |

* cited by examiner

METHOD OF MANUFACTURING SEMICONDUCTOR DEVICE

CROSS REFERENCE TO RELATED APPLICATIONS

This application claims foreign priority under 35 U.S.C. § 119(a)-(d) to Japanese Patent Application No. 2016-186956, filed on Sep. 26, 2016, the entire contents of which are hereby incorporated by reference.

FIELD OF THE INVENTION

The present disclosure relates to a method of manufacturing a semiconductor device.

BACKGROUND

Examples of a process for manufacturing a semiconductor device may include a film-forming process for forming an oxide film containing a predetermined element such as silicon (Si) on a substrate. The quality of the oxide film formed on the substrate is required to be improved.

SUMMARY

Described herein is a technique capable of improving the quality of an oxide film formed on a substrate.

According to one aspect described herein, a method of manufacturing a semiconductor device includes: (a) accommodating a substrate having a plurality of carbon-containing films protruding from a surface of the substrate; (b) forming a silicon-containing film on a surface of the plurality of carbon-containing films and a surface of the substrate by supplying a silicon-containing gas to the substrate; (c) forming a silicon/oxygen-containing film by supplying a first plasma of an oxygen-containing gas to the substrate; and (d) forming a silicon oxide film by supplying a second plasma of the oxygen-containing gas to the substrate after performing (c).

DETAILED DESCRIPTION

Hereafter, exemplary embodiments described herein will be described.

First Embodiment

Hereafter, a first embodiment described herein will be described with reference to the accompanying drawings.

(1) Configuration of Substrate Processing Apparatus

First, a substrate processing apparatus according to the first embodiment will be described.

The substrate processing apparatus 100 according to the first embodiment is a unit for forming an insulating film, for example. As exemplified in FIG. 1, the substrate processing apparatus 100 includes a single-wafer type substrate processing apparatus.

Figure 1:
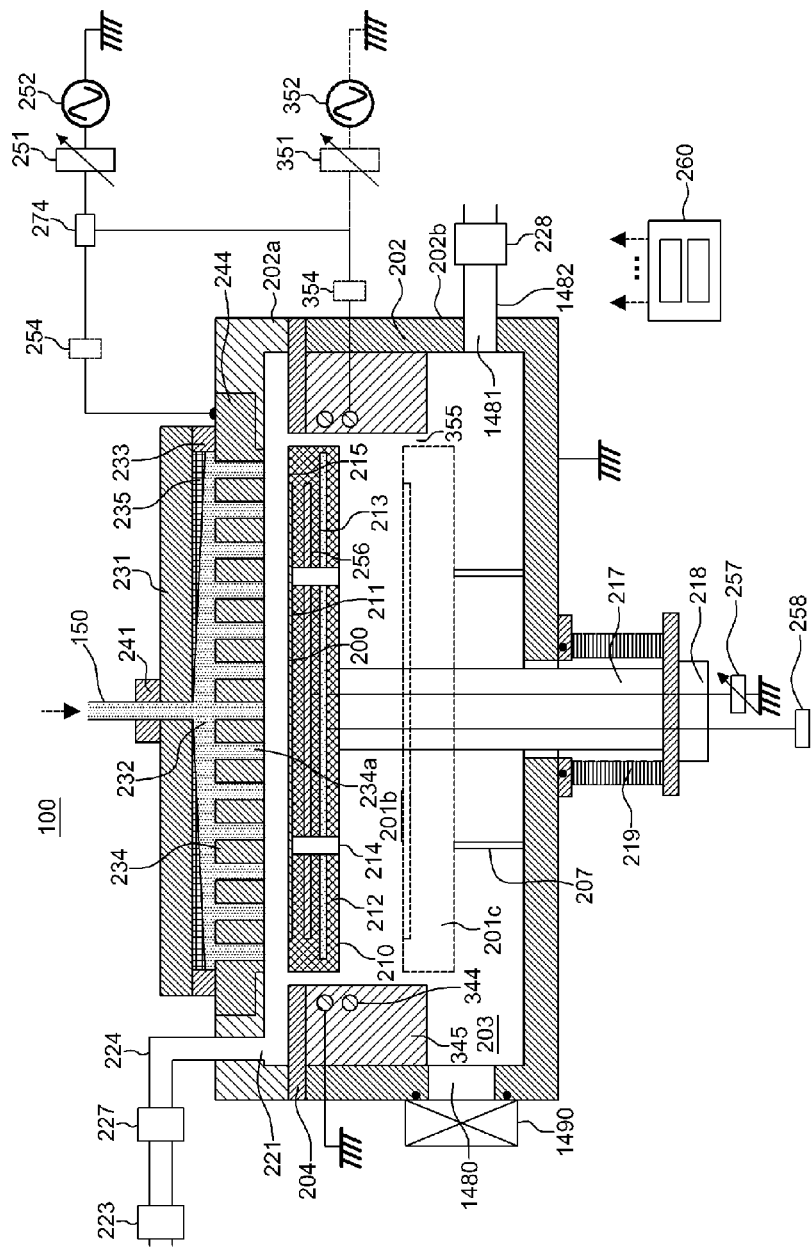
FIG. 1 is a diagram schematically illustrating a substrate processing apparatus according to a first embodiment described herein.

As illustrated in FIG. 1, the substrate processing apparatus 100 includes a process container 202. The process container 202 is a flat airtight container having a circular transverse cross-section, for example. The process container 202 is made of quartz or a metal such as aluminum and stainless steel. The process container 202 includes a first process space 201a referred to as "first process chamber", a second process space 201b referred to as "second process chamber" and a transfer space 203 referred to as "transfer chamber." In the first process space 201a, a wafer 200 such as a silicon wafer is processed. The process container 202 includes an upper container 202a and a lower container 202b. A boundary portion 204 is installed between the upper container 202a and the lower container 202b. In the space surrounded by the upper container 202a, the space above the boundary portion 204 is referred to as a first process chamber 201a, and the space under the boundary portion 204 and above a second exhaust port 1481 for exhausting the lower container 202b is referred to as a second process chamber 201b. Preferably, when a substrate support 210 is located at a second processing position 201c, the second process chamber 201b corresponds to the space under the boundary portion 204 and above a substrate placing surface 211. The space around the gate valve 1490, surrounded by the lower container 202b, is referred to as a transfer chamber 203.

A substrate loading/unloading port 1480 is installed at a side surface of the lower container 202b so as to be adjacent to a gate valve 1490. The wafer 200 is transferred between a transfer chamber (not illustrated) and the transfer chamber 203 through the substrate loading/unloading port 1480. Lift pins 207 are installed at the bottom of the lower container 202b. The lower container 202b is grounded.

The substrate support 210 is installed in the process chamber 201 and supports the wafer 200. The substrate support 210 includes a substrate placing table 212 having a substrate placing surface 211 on which the wafer 200 is placed and a heater 213 serving as a heating unit. Through-holes 214 through which the lift pins 207 are passed are formed at positions corresponding to the respective lift pins 207 of the substrate placing table 212. The heater 213 is connected to a temperature control unit 258, and the temperature control unit 258 may control the temperature of the heater 213. A bias electrode 256 may be installed in the substrate placing table 212. The bias electrode 256 applies a bias to the wafer 200 or the process chamber 201. The bias electrode 256 is connected to a bias control unit 257. The bias control unit 257 is configured to control the bias of the bias electrode 256.

A shaft 217 supports the substrate placing table 212. The shaft 217 is installed through the bottom of the process container 202, and connected to an elevating unit 218 outside the process container 202. As the elevating unit 218 is operated to move upward/downward the shaft 217 and the substrate placing table 212, the wafer 200 placed on the substrate placing surface 211 may be moved upward/downward. A bellows 219 covers the lower end part of the shaft 217, such that the inside of the process chamber 201 is airtightly maintained.

When the wafer 200 is transferred, the substrate placing table 212 is moved to a wafer transfer position. When the wafer 200 is subjected to a first process, the substrate placing table 212 is moved to a first process position (wafer processing position) indicated by a solid line in FIG. 1. When the wafer 200 is subjected to a third process, the substrate placing table 212 is moved to a second processing position 201c indicated by a dotted line in FIG. 1. The wafer transfer position is where the upper ends of the lift pins 207 protrude from the substrate placing surface 211.

Specifically, when the substrate placing table 212 is moved downward to the wafer transfer position, the upper ends of the lift pins 207 protrude from the substrate placing surface 211 and support the wafer 200 from thereunder. When the substrate placing table 212 is moved upward to the wafer processing position, the lift pins 207 are buried in the substrate placing surface 211, and the substrate placing surface 211 supports the wafer 200 from thereunder. Since the lift pins 207 come in direct contact with the wafer 200, the lift pins 207 are preferably made of a material such as quartz and alumina.

Exhaust System

A first exhaust port 221 serving as a first exhaust unit is installed at the inner wall of the process chamber 201 (upper container 202a), and exhausts the atmosphere of the process chamber 201. An exhaust pipe 224 is connected to the first exhaust port 221. A pressure controller 227 and a vacuum pump 223 are sequentially connected in series to the exhaust pipe 224. The pressure controller 227 may include an APC (Automatic Pressure Controller) for controlling the inner pressure of the process chamber 201 to a predetermined pressure. A first exhaust system (first exhaust line) includes the exhaust port 221, the exhaust pipe 224 and the pressure controller 227. The first exhaust system may further include a vacuum pump 223. The second exhaust port 1481 is installed at an inner wall of the transfer chamber, and exhausts the atmosphere of the transfer chamber 203. An exhaust pipe 1482 is installed at the second exhaust port 1481. A pressure controller 228 is installed at the exhaust pipe 1482, and configured to adjust the inside of the transfer chamber 203 to a predetermined pressure such that the transfer chamber 203 can be exhausted. The exhaust pipe 1482 and the pressure controller 228 may be configured to exhaust the inner atmosphere of the process chamber 201 through the transfer chamber 203.

Inlet Port

An inlet port 241 for supplying various gases into the process chamber 201 is installed at the upper surface (ceiling) of a shower head 234 installed at the top of the process chamber 201. The configurations of gas supply units connected to the inlet port 241 serving as a gas supply port will be described later.

Gas Dispersion Unit

The shower head 234 serving as a gas dispersion unit includes a buffer chamber 232 and a first electrode 244 which is a part of a first activation unit. The first electrode 244 includes a plurality of holes 234a formed therein, and the plurality of holes 234a disperses and supplies gas onto the wafer 200. The shower head 234 is installed between the inlet port 241 and the process chamber 201. The gas introduced through the inlet port 241 is supplied into the buffer chamber 232 of the shower head 234 (also referred to as a dispersion unit), and supplied into the process chamber 201 through the plurality of holes 234a.

The first electrode 244 is made of a conductive metal, and serves as a part of the activation unit (excitation unit) for exciting gas. Electromagnetic waves (high-frequency power or microwaves) may be supplied to the first electrode 244. When a lid 231 is made of a conductive member, an insulating block 233 is installed between the lid 231 and the first electrode 244, and insulates the lid 231 and the first electrode 244 from each other.

A gas guide 235 may be installed in the buffer chamber 232. The center of the gas guide 235 corresponds to the inlet port 241, and the gas guide 235 is cone-shaped with the diameter thereof increasing toward the peripheral portion of the wafer 200. The lowermost end portion of the gas guide 235 is disposed outer than the end portion of the region where the plurality of holes 234a are installed. The installation of the gas guide 235 allows gas to be uniformly supplied to the plurality of holes 234a. Thus, the amount of active species supplied onto the surface of the wafer 200 can be uniformized.

First Activation Unit (First Plasma Generation Unit)

A matcher 251 and a high-frequency power supply 252 are connected to the first electrode 244 serving as a part of the first activation unit through a switch 274, and configured to supply electromagnetic waves (high-frequency power or microwaves) to the first electrode 244. The supply of the electromagnetic waves to the first electrode 244 can activate gas supplied into the first process chamber 201a. The first electrode 244 is configured to generate capacitively coupled plasma. Specifically, the first electrode 244 is a conductive plate-shaped member, and supported by the upper container 202a. The first activation unit includes at least the first electrode 244, the matcher 251 and the high-frequency power supply 252. The first activation unit may further include an impedance meter 254. The impedance meter 254 may be installed between the first electrode 244 and the high-frequency power supply 252. Based on impedance measured by the impedance meter 254, the matcher 251 and the high-frequency power supply 252 may be feedback controlled.

Second Activation Unit (Second Plasma Generation Unit)

The matcher 251 and the high-frequency power supply 252 are connected to a second electrode 344 serving as a part of the second activation unit through a switch 274, and configured to supply electromagnetic waves (high-frequency power or microwaves) to the second electrode 344. The supply of the electromagnetic waves to the second electrode 344 can activate gas supplied into the second process chamber 201b. The second electrode 344 is configured to generate inductively coupled plasma. The generation of the inductively coupled plasma can produce a large amount of active species in the second process chamber 201b. Specifically, the second electrode 344 has a coil shape. Since the second electrode 344 is covered by a quartz member 345, the second electrode 344 does not come in direct contact with gas. The quartz member 345 may act as a guide for gas supplied into the second process chamber 201b through the inlet port 241. Through the quartz member 345, gas is uniformly supplied onto the wafer 200 located in the second process chamber 201b. Preferably, the substrate support 210 is disposed in such a manner that the lower end of the quartz member 345 is positioned under the upper end 215 of the substrate placing table 212. The position in this case is referred to as the second processing position 201c. In such an arrangement of the components, a gas exhaust passage 355 may be disposed around the substrate placing table 212. Therefore, gas may be uniformly exhausted through the peripheral portion of the wafer 200. Instead of the switch 274, a matcher 351 and a high-frequency power supply 352 may be installed. The high-frequency power supply 352 and the matcher 251 may supply power to the second electrode 344.

Gas Supply System

A gas supply pipe 150 is connected to the inlet port 241. First to fourth gases and a purge gas, which are described later, are supplied through the gas supply pipe 150.

Figure 2:
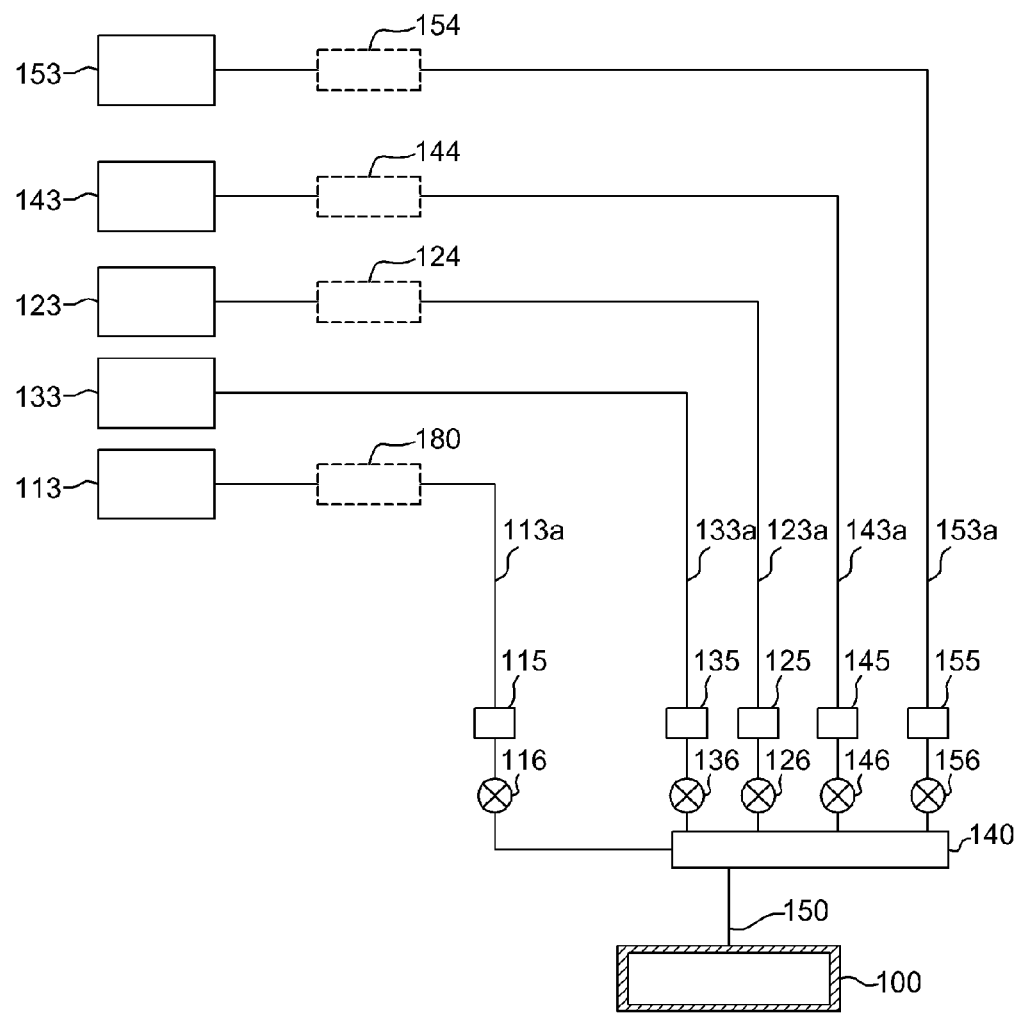
FIG. 2 is a diagram schematically exemplifying a gas supply system according to the first embodiment.

FIG. 2 is a diagram illustrating a schematic constitution of a gas supply system including first to fourth gas supply units and a purge supply unit.

As illustrated in FIG. 2, a gas supply pipe merging unit 140 is connected to the gas supply pipe 150. A first gas (processing gas) supply pipe 113a, a purge gas supply pipe 133a, a second gas (processing gas) supply pipe 123a, a third gas (modification gas) supply pipe 143a and a fourth gas (additive gas) supply pipe 153a are connected to the gas supply pipe merging unit 140.

First Gas Supply Unit

The first gas supply unit includes the first gas supply pipe 113a, an MFC (Mass Flow Controller) 115 and a valve 116, which are installed at the first gas supply pipe 113a. The first gas supply unit may further include a first gas supply source 113 connected to the first gas supply pipe 113a. When the source of a processing gas is liquid or solid, the first gas supply unit may further include a vaporizer 180 installed at the first gas supply pipe 113a.

Second Gas Supply Unit

The second gas supply unit includes the second gas supply pipe 123a, an MFC 125 and a valve 126, which are installed at the second gas supply pipe 123a. The second gas supply unit may further include a second gas supply source 123 connected to the second gas supply pipe 123a. The second gas supply unit may further include an RPU (Remote Plasma Unit) 124 which is installed at the second gas supply pipe 123a so as to activate the second gas.

Purge Gas Supply Unit

A purge gas supply unit includes the purge gas supply pipe 133a, an MFC 135 and a valve 136, which are installed at the purge gas supply pipe 133a. The purge gas supply unit may further include a purge gas supply source 133 connected to the purge gas supply pipe 133a.

Third Gas Supply Unit

The third gas supply unit (also referred to as "modification gas supply unit) includes the third gas supply pipe 143a, an MFC 145 and a valve 146, which are installed at the third gas supply pipe 143a. The third gas supply unit may further include a third gas supply source 143 connected to the third gas supply pipe 143a. The third gas supply unit may further include an RPU 144 which is installed at the third gas supply pipe 143a so as to activate the third gas.

Fourth Gas Supply Unit

The fourth gas supply unit (also referred to as "additive gas supply unit") includes the fourth gas supply pipe 153a, an MFC 155 and a valve 156, which are installed at the fourth gas supply pipe 153a. The fourth gas supply unit may further include a fourth gas supply source 153 connected to the fourth gas supply pipe 153a. The fourth gas supply unit may further include an RPU 154 which is installed at the fourth gas supply pipe 153a so as to activate the fourth gas.

Controller

As illustrated in FIG. 1, the substrate processing apparatus 100 includes a controller 260 for controlling the operations of the components of the substrate processing apparatus 100.

Figure 3:
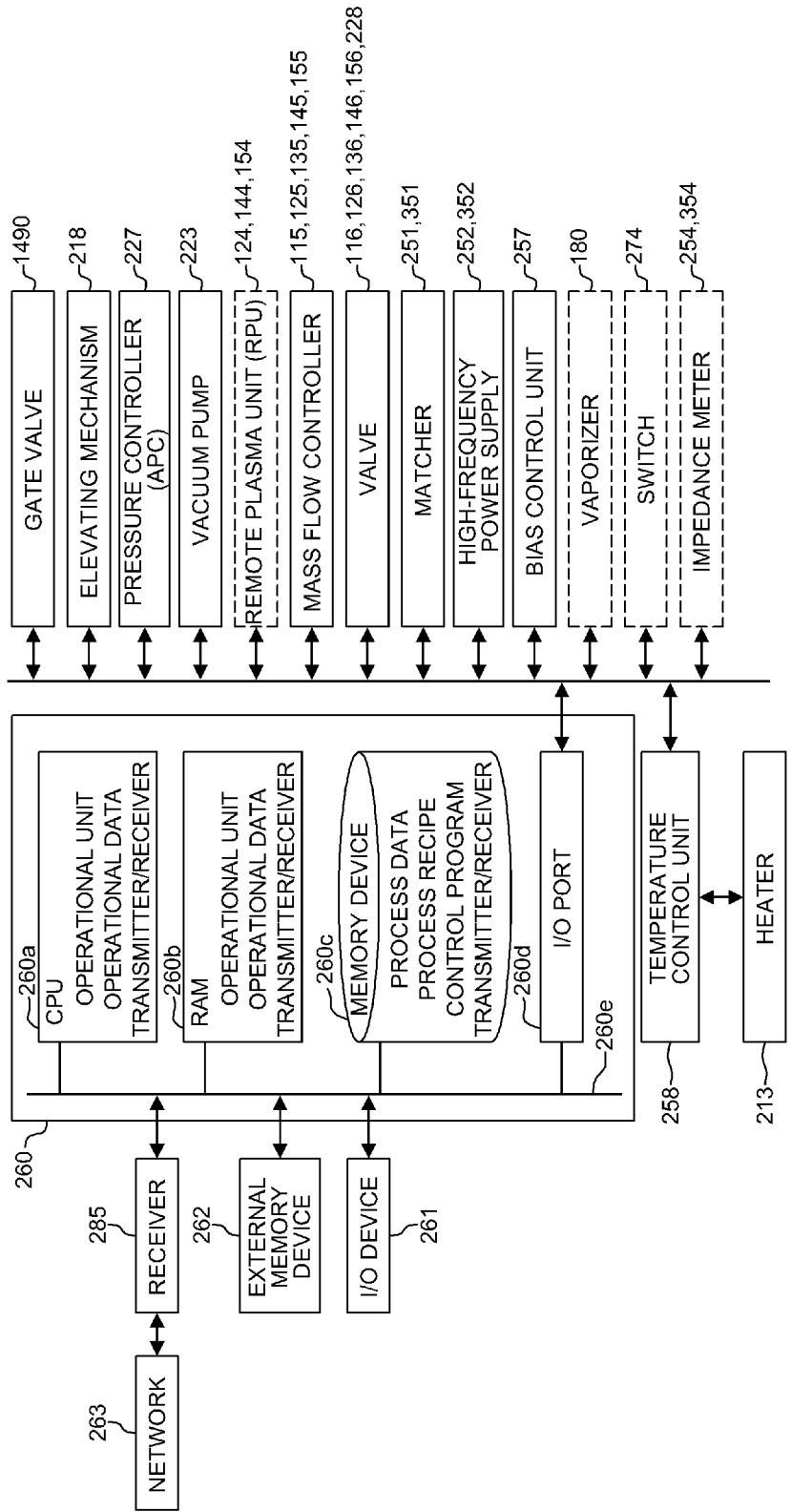
FIG. 3 is a diagram schematically exemplifying a controller of the substrate processing apparatus according to the first embodiment described herein.

FIG. 3 schematically illustrates the controller 260. The controller 260 serving as a control unit is embodied by a computer including a CPU (Central Processing Unit) 260a, a RAM (Random Access Memory) 260b, a memory device 260c and an I/O port 260d. The RAM 260b, the memory device 260c and the I/O port 260d may exchange data with the CPU 260a through an internal bus 260e. For example, an I/O device 261 such as a touch panel, an external memory device 262 and a receiver 285 may be connected to the controller 260.

The memory device 260c is embodied by a component such as a flash memory and HDD (Hard Disk Drive). The memory device 260c may readably store at least a part of a control program for controlling an operation of the substrate processing apparatus, a process recipe in which the sequence or condition of a substrate processing process described later is described, and operational data or process data generated during a process required until a process recipe used for processing the wafer 200 is set. The process recipe is obtained by combining steps of the substrate processing processes described later such that the controller 260 is executed to acquire a predetermined result, and functions as a program. Hereafter, data such as the process recipe and the control program are collectively referred to as a program. In this specification, "program" may indicate only the process recipe, indicate only the control program, or indicate both of the process recipe and the control program. The RAM 260b is a work area where a program read by the CPU 260a and data such as operational data and process data are temporarily stored.

The I/O port 260d is connected to components such as the gate valve 1490, the elevating unit 218, the temperature control unit 258, the pressure controller 227, the vacuum pump 223, the matchers 251 and 351, the high-frequency power supplies 252 and 352, the MFCs 115, 125, 135, 145 and 155, the valves 116, 126, 136, 146, 156 and 228, and the bias control unit 257. The I/O port 260d may be connected to components such as the RPUs 124, 144 and 154, the vaporizer 180 and the impedance meters 254 and 354. The I/O port 260d may be connected to the switch 274.

The CPU 260a serving as an operational unit is configured to read a control program from the memory device 260c and execute the read control program. Furthermore, the CPU 260a is configured to read a process recipe from the memory device 260c according to an operation command inputted from the I/O device 261. The CPU 260a is configured to compare a setting value inputted from the receiver 285 to the process recipes or control data stored in the memory device 260c, and calculate operational data. The CPU 260a is configured to execute a process such as a process of deciding process data (process recipe) corresponding to the operational data. According to the contents of the read process recipe, the CPU 260a controls operations such as an opening/closing operation of the gate valve 1490, an elevating operation of the elevating unit 218, a power supply operation to the heater 213 through the temperature control unit 258, a pressure control operation of the pressure controller 227, on/off control for the vacuum pump 223, gas flow rate control operations of the MFCs 115, 125, 135, 145 and 155, gas activation operations of the RPUs 124, 144 and 154, gas on/off control for the valves 116, 126, 136, 146, 156 and 228, a power matching operation of the matcher 251, a power control operation of the high-frequency power supply 252, a control operation of the bias control unit 257, matching operations of the matchers 251 and 351 based on data measured by the impedance meters 254 and 354, power control operations of the high-frequency power supplies 252 and 352, and an on/off operation of the switch 274. When the CPU 260a controls the operations of the respective components, a receiver/transmitter of the CPU 260a receives/transmits control information based on the contents of the process recipe.

The controller 260 is not limited to a dedicated computer, but may be embodied by a general use computer. For example, the controller 260 according to the first embodiment may be embodied by preparing the external memory device 262 storing the above-described program therein and installing a program in a general use computer through the external memory device 262. The external memory device 262 may include a magnetic disk such as a magnetic tape, flexible disk and hard disk, an optical disk such as CD and DVD, a magneto-optical disk such as MO, and a semiconductor memory such as a USB memory and memory card. The unit for supplying a program to the computer is not limited to the configuration for supplying a program through the external memory device 262. For example, a program may be directly supplied through a communication unit such as the receiver 285 and a network (Internet or dedicated line) 263, without the external memory device 262 therebetween. The memory device 260c or the external memory device 262 is embodied by a transitory computer readable recording medium. Hereafter, the memory device 260c and the external memory device 262 are collectively referred to as recording media. In this specification, "recording media" may indicate only the memory device 260c, indicate only the external memory device 262, and indicate both of the memory device 260c and the external memory device 262.

(2) Substrate Processing Process

An example of a substrate processing process for forming a silicon oxide (SiO) film on a wafer 200 using the above-described substrate processing apparatus will be described as one of the processes for manufacturing a semiconductor device, with reference to FIGS. 4 through 10. In the following descriptions, the operations of the components constituting the substrate processing apparatus are controlled by the controller 260.

The substrate processing process illustrated in FIGS. 4 through 7 includes first to third process steps which are performed in the same process chamber 201. The first process step (also referred to as "film-forming step") is to form a silicon-containing film 403 on a wafer 200 by supplying aminosilane gas and disilane ($Si_2H_6$, DS) gas onto the wafer 200 heated to a first temperature, the second process step (also referred to as "oxidation step") is to form a silicon/oxygen-containing film 404 by generating first plasma on the wafer 200 and oxidizing the silicon-containing film 403, and the third process step (also referred to as "treatment step") is to form a silicon oxide film 405 by generating second plasma on the wafer 200 and subjecting the silicon/oxygen-containing film 404 to a plasma treatment.

At the above-described film-forming step, the silicon-containing film 403 is formed on the wafer 200a, while a cycle is performed a predetermined number of times, the cycle including a step S203 of supplying aminosilane gas as the first gas onto the wafer 200 and a step S205 of supplying DS gas as the second gas onto the wafer 200. The steps S203 and S205 are alternately performed according to gas supply timings exemplified in FIG. 8.

In this specification, "wafer" indicates "a wafer itself", or indicates "a stacked body (aggregate) of the wafer and a predetermined film or layer formed on the wafer". That is, the wafer and the predetermined layer or film formed on the surface of the wafer may be collectively referred to as "wafer". In this specification, "surface of wafer" indicates "a surface (exposed surface) of a wafer" or "a surface of a predetermined layer or film formed on the wafer, i.e. the uppermost surface of the wafer as a stacked body".

Thus, in this specification, "supplying a predetermined gas onto a wafer" indicates "directly supplying the predetermined gas onto the surface (exposed surface) of the wafer", or indicates "supplying the predetermined gas onto a layer or film formed on the wafer, i.e. the uppermost surface of the wafer as a stacked body". In this specification, "forming a predetermined film or layer on a wafer" indicates "directly forming the predetermined film or layer on the surface (exposed surface) of the wafer", or indicates "forming the predetermined film or layer on a film or layer formed on the wafer, i.e. the uppermost surface of the wafer as a stacked body".

Furthermore, even when a term "substrate" is used in this specification, it may indicate that a term "wafer" is used. In this case, the wafer may be replaced with the substrate in the above descriptions.

Substrate Loading Step S201

Figure 4:
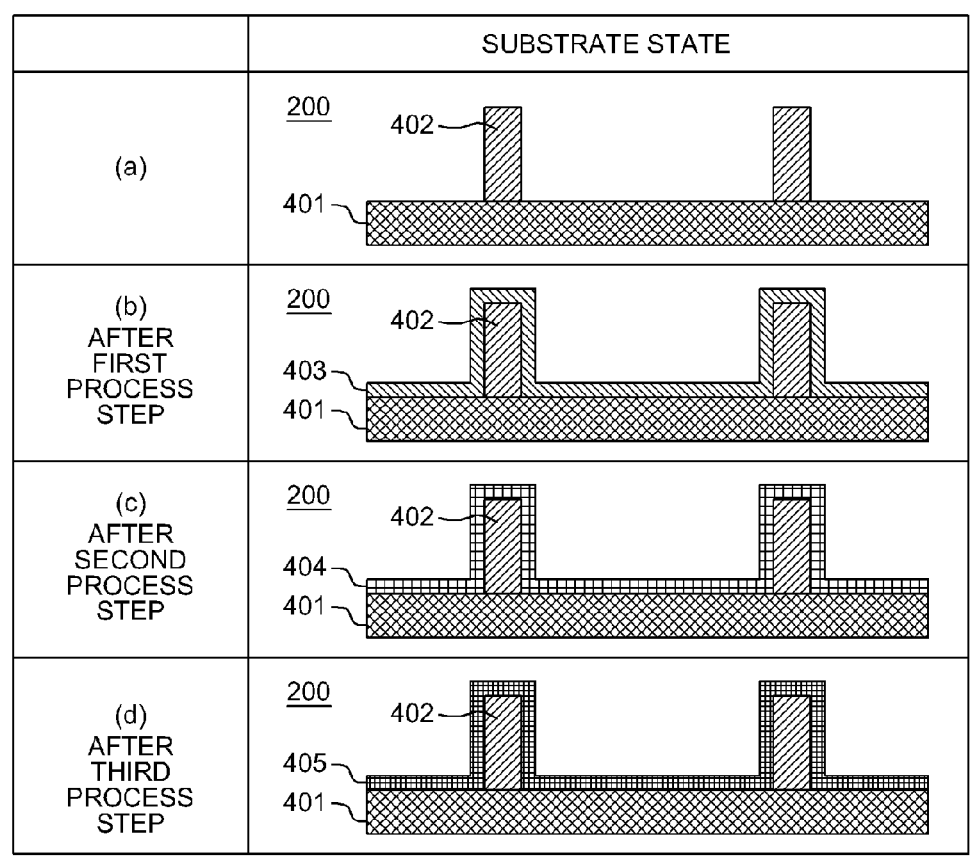
FIG. 4 is a diagram exemplifying a state of a substrate after steps according to the first embodiment described herein are performed.
Figure 5:
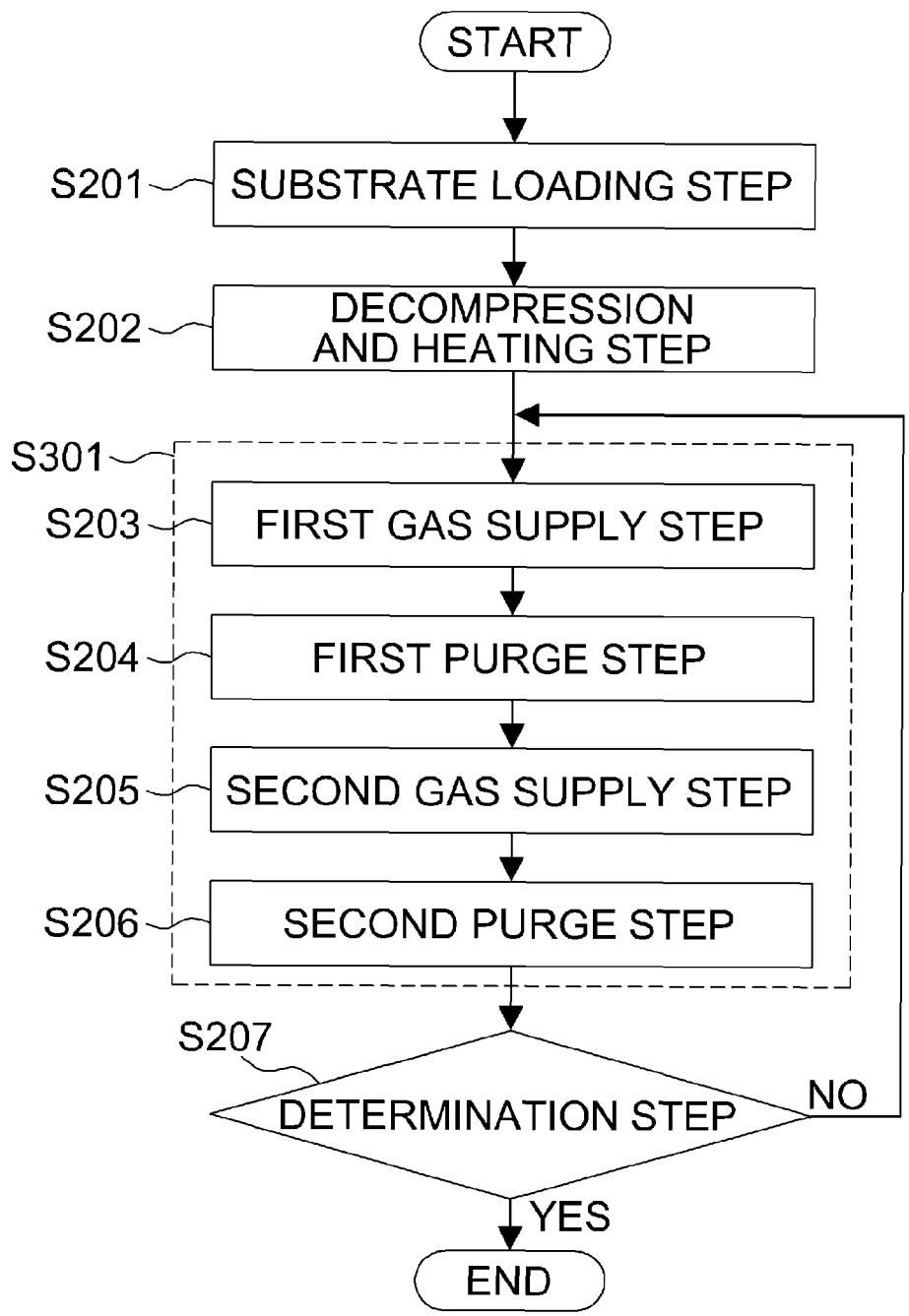
FIG. 5 is a flowchart exemplifying a first process step according to the first embodiment described herein.
Figure 6:
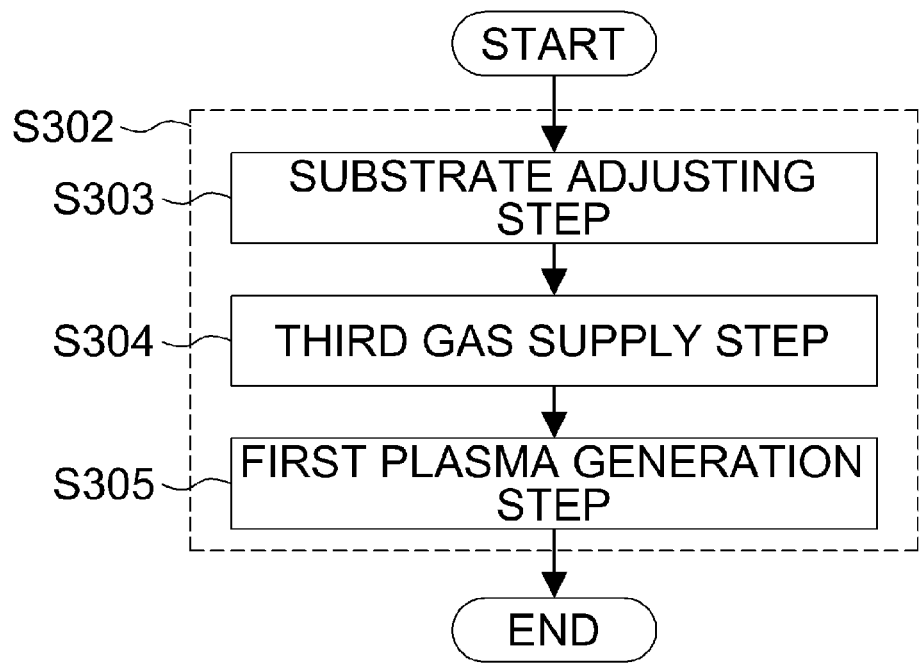
FIG. 6 is a flowchart exemplifying a second process step according to the first embodiment described herein.
Figure 7:
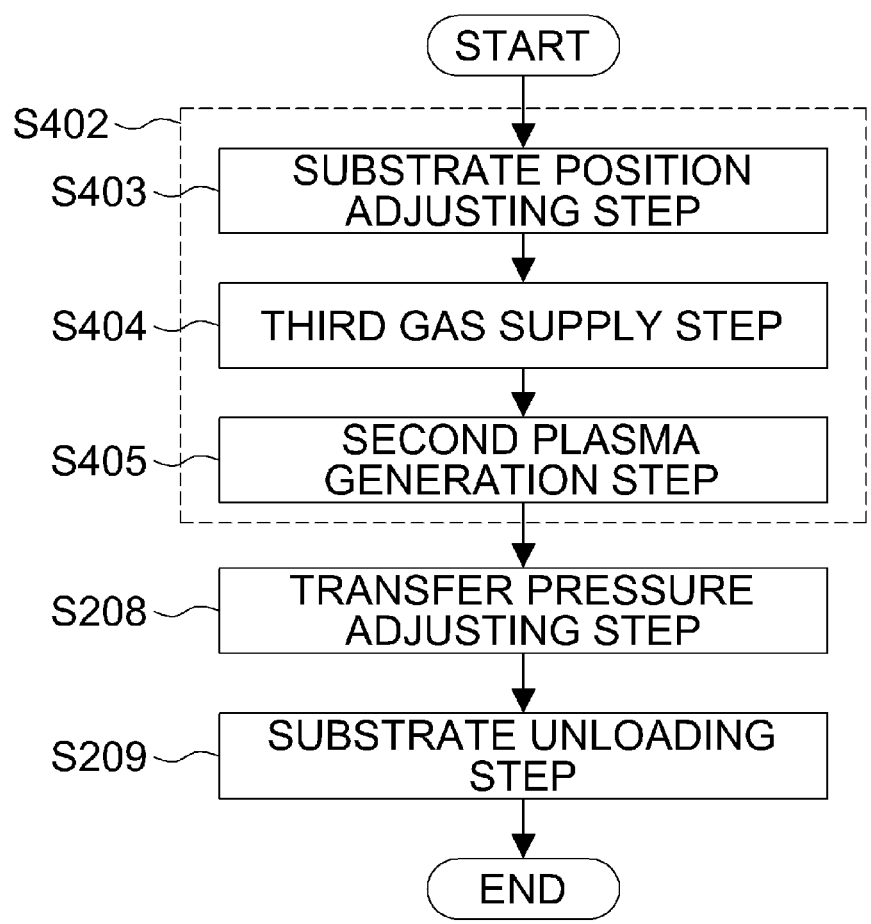
FIG. 7 is a flowchart exemplifying a third process step according to the first embodiment described herein.

The substrate processing process starts with step S201 in which the wafer 200 is loaded into the first process chamber 201a. Specifically, the substrate support 210 is moved downward by the elevating unit 218, and the lift pins 207 protrude from the upper surface of the substrate support 210 through the through-holes 214. After the inner pressure of the process chamber 201 (201a and 201b) or the inner pressure of the transfer chamber 203 is adjusted to a predetermined pressure, the gate valve 1490 is opened. Through the gate valve 1490, the wafer 200 is placed on the lift pins 207. After the wafer 200 is placed on the lift pins 207, the gate valve 1490 is closed. When the substrate support 210 is moved upward to a predetermined position by the elevating unit 218, the wafer 200 is transferred to the substrate support 210 from the lift pins 207. As illustrated in FIG. 4, a plurality of carbon-containing films 402 protruding from a surface layer 401 of the wafer 200 is formed on the surface layer 401. The carbon-containing film 402 is a core used for double patterning. The carbon-containing film 402 is a carbon film, for example. The surface layer 401 is formed on the surface of a silicon substrate, that is, the wafer 200. Preferably, the carbon-containing film 402 has a line shape. The line-shaped core needs to be maintained until double patterning is finished. However, the core may be deformed because of the following reasons. For example, when carbon is desorbed, the core may be deformed. Specifically, when an element of another film or gas supplied to form another film reacts with carbon of the carbon-containing film 402, carbon may be desorbed to deform the core.

Decompression and Heating Step S202

Then, the first process chamber 201a is exhausted through the exhaust pipe 224, until the inner pressure of the first process chamber 201a becomes a predetermined pressure (vacuum level). At this time, based on a pressure value measured by a pressure sensor (not illustrated), the opening degree of the APC valve serving as the pressure controller 227 is feedback controlled. Based on a temperature value detected by a temperature sensor (not illustrated), the amount of electricity supplied to the heater 213 is feedback controlled until the internal temperature of the first process chamber 201a becomes a predetermined temperature. Specifically, the substrate support 210 is heated by the heater 213 in advance. When the temperature of the wafer 200 or the substrate support 210 is stabilized, the state is maintained for a predetermined time. When matters such as water and gas desorbed from a member remain in the process chamber 201, the matters may be removed through vacuum exhaust or removed by supplying N2 gas to purge the process chamber 201. In this way, the preparation before the film forming process is completed.

Moreover, the inner pressure of the process chamber 201 may be exhausted to such a vacuum level that can be reached at a time.

At this time, the heater 213 is maintained at a constant temperature ranging from 100° C. to 600° C., preferably from 100° C. to 500° C., and more preferably from 250° C. to 450° C.

Preferably, before the wafer 200 reaches a predetermined temperature, a cyclic purge process is performed, the cyclic purge process including a process of performing vacuum exhaust and a process of supplying inert gas. By performing the cyclic purge process, the oxygen concentration of the first process chamber 201a may be lowered to suppress a reaction between residual oxygen and the carbon-containing film 402.

Film-Forming Step S301

Next, an example in which the silicon-containing film 403 is formed on the wafer 200 will be described as the first process. The film-forming step S301 will be described in detail with reference to FIGS. 4, 5 and 8.

After the wafer 200 is placed on the substrate support 210 and the atmosphere of the first process chamber 201a is stabilized, steps S203 through 207 are performed.

First Gas Supply Step S203

At a first gas supply step S203, aminosilane gas is supplied as the first gas (processing gas) into the first process chamber 201a through the first gas supply unit. Specifically, after the flow rate of aminosilane gas supplied from the first gas supply source 113 is adjusted by the MFC 115, the aminosilane gas is supplied into the substrate processing apparatus 100. The aminosilane gas with the flow rate thereof adjusted is supplied into the first process chamber 201a in its compressed state, through the buffer chamber 232 and the gas supply holes 234a of the shower head 234. While the process chamber 201 is continuously exhausted by the exhaust system, the inner pressure of the first process chamber 201a is controlled to a predetermined pressure. With the inner pressure of the first process chamber 201a at the predetermined pressure, the aminosilane gas is supplied onto the wafer 200. The aminosilane gas is supplied at a first pressure into the first process chamber 201a, the first pressure ranging from 10 Pa to 1,000 Pa. In this way, the aminosilane gas is supplied onto the wafer 200. The supply of the aminosilane gas forms a silicon-containing layer on the wafer 200. In the first embodiment, the aminosilane gas may include one of butylamino silane (BAS) gas, bis(butylamino)silane (BTBAS) gas, dimethylamino silane (DMAS) gas, bis(dimethylamino)silane (BDMAS) gas, tris(dimethylamino)silane (3DMAS) gas, (diethylamino)silane (DEAS) gas, bis(diethylamino)silane (BDEAS) gas, dipropyl aminosilane (DPAS) gas and diisopropylamino silane (DIPAS) gas. In this specification, a silicon-containing layer contains silicon (Si) as a main component, and includes at least one or more of carbon (C), chlorine (Cl) and nitrogen (N). Hereafter, the first embodiment in which the silicon-containing layer includes Si and C will be described in detail.

First Purge Step S204

After the silicon-containing layer is formed on the wafer 200, the gas valve 116 of the first gas supply pipe 113a is closed to stop the supply of the aminosilane gas. The first purge step S204 includes stopping supplying the first gas and exhausting the first gas present in the process chamber 201 or the processing gas present in the buffer chamber 232 through the first exhaust unit.

The first purge step S204 may include not only a process of discharging gas by simply exhausting (vacuum-suctioning) gas but also a process of discharging gas by extruding a residual gas using an inert gas supplied from the purge gas supply source 133. In this case, the valve 136 is opened, and the flow rate of the inert gas is adjusted by the MFC 135. At the first purge step S204, the process of vacuum-suctioning gas and the process of supplying inert gas may be combined and performed, or alternately performed.

After a predetermined time has passed, the valve 136 is closed to stop the supply of the inert gas. However, with the valve 136 open, the inert gas may be continuously supplied.

At this time, the temperature of the heater 213 is set to the same temperature as the first gas is supplied to the wafer 200. The flow rate of $N_2$ gas serving as a purge gas supplied through the inert gas supply system may range from 100 sccm to 20,000 sccm. In addition to $N_2$ gas, rare gases such as argon (Ar), helium (He), neon (Ne), and xenon (Xe) may be used as the purge gas.

Second Gas Supply Step S205

After the first purge step S204, DS gas is supplied as the second gas (processing gas) into the first process chamber 201a through the second gas supply unit. Specifically, the valve 126 is opened, and the DS gas is supplied into the first process chamber 201a through the inlet port 241, the buffer chamber 232 and the plurality of holes 234a. The second gas is also referred to as a processing gas for processing the wafer 200 or a reactive gas which reacts with the first gas, the silicon-containing gas and the wafer 200. The second gas includes a compound of silicon and hydrogen, and is not limited to Si2H6.

At this time, the flow rate of the supplied DS gas is adjusted to a predetermined flow rate by the MFC 125. The flow rate of the supplied DS gas may range from 1 sccm to 10,000 sccm.

When the DS gas is supplied onto the silicon-containing layer formed on the wafer 200, the silicon-containing layer is modified to form a silicon layer with a predetermined thickness. The silicon layer has a predetermined thickness and distribution depending on conditions such as the inner pressure of the first process chamber 201a, the flow rate of DS gas and the temperature of the wafer 200, for example.

After a predetermined time has passed, the valve 126 is closed to stop the supply of the DS gas.

At this time, the temperature of the heater 213 is set to the same temperature as the first gas is supplied to the wafer 200.

Second Purge Step S206

The second purge step S206 is performed by the same operation as the first purge step S204. That is, the second purge step S206 includes stopping the supply of the DS gas and exhausting the DS gas present in the process chamber 201 or the buffer chamber 232 through the first exhaust unit. Through a purge gas supplied into the buffer chamber 232 and the process chamber 201, the buffer chamber 232 and the process chamber 201 may be purged.

Determination Step S207

After the second purge step S206, the controller 260 determines whether the film-forming step S301 including steps S203 through S206 was performed a predetermined number of times (n times). That is, the controller 260 determines whether the silicon-containing film 403 was formed to a desired thickness on the wafer 200. Through the determination step S207 of determining whether a cycle including the steps S203 through S206 was performed at least one or more times, the silicon-containing film 403 with a predetermined thickness may be formed on the wafer 200. The cycle may be performed a plurality of times. As the cycle is performed a plurality of times, the silicon-containing film 403 with a predetermined thickness is formed on the wafer 200. In the first embodiment, the silicon-containing film 403 contains Si as the main component, and includes at least one or more of C, Cl and N therein. Hereafter, a film containing Si as the main component and including C remaining therein is exemplified as the silicon-containing film 403, and the first embodiment is described in detail.

When it is determined at the determination step S207 that the film-forming step S301 was not performed the predetermined number of times ("N" in FIG. 5), the cycle of the film-forming step S301 is repeated. On the other hand, when it is determined at the determination step S207 that the film-forming step S301 was the predetermined number of times ("Y" in FIG. 5), the film-forming step S301 is ended, and a second process step S302 is performed.

Second Process (Oxidation) Step S302

Next, a process of oxidizing the silicon-containing film 403 formed on the wafer 200 will be described as the second process. The second process step S302 will be described in detail with reference to FIGS. 4 and 6.

Substrate Adjusting Step S303

When the second process is performed, the inner pressure of the first process chamber 201a is adjusted to a predetermined pressure. The potential of the bias electrode 256 may be adjusted. After at least one of the inner pressure of the first process chamber 201a and the potential of the bias electrode 256 is adjusted, a third gas supply step S304 is performed. The temperature of the heater 213 is adjusted to the same temperature as or similar temperature to the temperature when the first process is performed.

In order to suppress movement of Si atoms included in the silicon-containing film 403 (migration) or desorption of Si from the silicon-containing film 403 (thermal etching), the temperature of the wafer 200 may be adjusted to a lower temperature than when the first process is performed.

The migration of Si atoms occurs when the Si atoms thermally vibrate due to thermal energy. Thus, in order to suppress the migration, the temperature of the wafer 200 may be set to a low temperature. For example, the temperature of the wafer 200 may be adjusted to a lower temperature than when the first process is performed. Furthermore, immediately before first plasma described later is generated, the temperature of the wafer 200 may be adjusted to the same temperature as the first process is performed. Suppressing the migration of Si atoms can prevent a change in state (for example, thickness) of the silicon-containing film 403. The migration of Si atoms may locally change the surface roughness of the silicon-containing film 403. The change of the surface roughness may have an influence on the characteristic of the semiconductor device. The thermal etching is caused by sublimation of Si.

Third Gas Supply Step S304

At a third gas supply step S304, oxygen (02) gas is supplied as the third gas (oxidation gas) into the first process chamber 201a through the third gas supply system. Specifically, after the flow rate of $O_2$ gas supplied from the third gas supply source 143 is adjusted by the MFC 145, the $O_2$ gas is supplied into the substrate processing apparatus 100. The $O_2$ gas with the flow rate thereof adjusted is supplied into the first process chamber 201a in its decompressed state, through the buffer chamber 232 and the gas supply holes 234a of the shower head 234. While the inner atmosphere of the first process chamber 201a is continuously exhausted through the first exhaust port 221, the inner pressure of the first process chamber 201a is adjusted to a predetermined pressure. At this time, the $O_2$ gas is supplied at a second pressure onto the wafer 200 in the first process chamber 201a, the second pressure ranging from 10 Pa to 1,000 Pa.

First Plasma Generation Step S305

High-frequency power is supplied to the first electrode 244 through he matcher 251 from the high-frequency power supply 252. The supply of the high-frequency power to the first electrode 244 generates plasma (first plasma) of the third gas in the holes 234a or the first process chamber 201a. The first plasma includes active species of the third gas. When the activated $O_2$ gas is supplied onto the silicon-containing film 403 formed on the wafer 200, the silicon-containing film 403 is modified to form a silicon/oxygen-containing film 404. When the plasma is generated right above the wafer 200 through the first electrode 244, active species containing a large amount of ion component may be supplied to the wafer 200. Therefore, only the surface of the silicon-containing film 403 may be oxidized. The surface oxidation of the silicon-containing film 403 can suppress cohesion or desorption of Si, thereby preventing a degradation in surface roughness of the silicon oxide (SiO) film 405 which is finally formed. Furthermore, carbon may remain in the silicon-containing film 403. The remaining carbon may be removed at the third process step. Since the first plasma generated through the first electrode 244 is capacitively coupled plasma, the amount of ion component supplied to the wafer 200 is larger than the amount of ion component contained in second plasma described later.

After the first plasma is generated to process the wafer 200 for a predetermined time, the supply of the power to the first electrode 244 and the supply of the third gas into the first process chamber 201a are stopped, and the inner atmosphere of the first process chamber 201a is exhausted. When the inner atmosphere of the first process chamber 201a is exhausted, the atmosphere may be purged in the same manner as the first purge step S204.

Although the supply of high-frequency power is started after the supply of third gas, the high-frequency power may be supplied before the third gas is supplied.

As the potential of the bias electrode 256 installed in the substrate placing table 212 is controlled by the bias control unit 257, the amount of charged particles supplied to the wafer 200 may be adjusted.

The second process may be performed in the same process chamber as the process chamber where the first process is performed, that is, the first process chamber 201a. When the second process is performed in the first process chamber 201a, it is possible to suppress migration of silicon atoms in the silicon-containing film 403.

Third Process (Treatment) Step S402

Next, a process of treating the silicon/oxygen-containing film 404 formed on the wafer 200 will be described as the third process. The third process step S402 will be described in detail with reference to FIG. 7.

Substrate Position Adjusting Step S403

When the third process is performed, the wafer 200 is moved downward to the second processing position 201c indicated by a dotted line in FIG. 1. Specifically, the substrate support 210 is moved downward by the elevating unit 218. At this time, the wafer 200 is located in the second process chamber 201b which is the space under the first process chamber 201a and communicates with the first process chamber 201a. The inner pressure of the second process chamber 201b is adjusted to a predetermined pressure. When the inner pressure is adjusted, the inner atmosphere of the second process chamber 201b is not exhausted through the first exhaust port 221, but exhausted through the second exhaust port 1481. The temperature of the heater 213 or the potential of the bias electrode 256 may be adjusted. After the components are adjusted as described above, a third gas supply step S304 is performed.

Third Gas Supply Step S404

At the third gas supply step S404, $O_2$ gas is supplied as the third gas (treatment gas) into the second process chamber 201b through the third gas supply system. Specifically, after the flow rate of $O_2$ gas supplied from the third gas supply source 143 is controlled by the MFC 145, the $O_2$ gas is supplied into the substrate processing apparatus 100. The $O_2$ gas with the flow rate thereof adjusted is supplied into the second process chamber 201b through the buffer chamber 232, the gas supply holes 234a of the shower head 234 and the first process chamber 201a in its decompressed state. The inner atmosphere of the second process chamber 201b is continuously exhausted through the second exhaust port 1481 until the inner pressure of the second process chamber 201b is adjusted to a predetermined pressure. The $O_2$ gas is supplied at a third pressure onto the wafer 200 in the second process chamber 201b, the third pressure ranging from 10 Pa to 1,000 Pa.

Second Plasma Generation Step S405

The switch 274 may be switched to supply power from the high-frequency power supply 252 to the second electrode 344. After the switch 274 is switched, high-frequency power is supplied to the second electrode 344 installed in the quartz member 345. The supply of the high-frequency power to the second electrode 344 generates second plasma (active species) of the third gas in the second process chamber 201b (second electrode 344). As the activated $O_2$ gas is supplied onto the silicon/oxygen-containing film 404 formed on the wafer 200, a treatment process is performed. Specifically, oxygen of the activated $O_2$ gas removes carbon remaining in the silicon/oxygen-containing film 404. At this time, the carbon is discharged as CO gas. As the oxygen of the activated $O_2$ gas is adsorbed to the site of the removed carbon or another site, the characteristic of the silicon/oxygen-containing film 404 is improved (modified). The improvement (modification) in characteristic of the silicon/oxygen-containing film 404 forms a silicon oxide (SiO) film 405. In the first embodiment, the second plasma is inductively coupled plasma, because the second plasma is generated by the coil-shaped second electrode 344. The inductively coupled plasma may be generated regardless of the distance between the electrode and the wafer 200. Thus, when the positions of the wafer 200 and the electrode are adjusted, the amount of ion component supplied to the wafer 200 by the inductively coupled plasma may be adjusted to a smaller amount than the amount of ion component supplied to the wafer 200 by the above-described inductively coupled plasma.

After the plasma is generated to process the wafer 200 for a predetermined time, the supply of the power to the second electrode 344 and the supply of the third gas into the second process chamber 201b are stopped, and the inner atmosphere of the second process chamber 201b is exhausted. When the inner atmosphere of the second process chamber 201b is exhausted, the atmosphere may be purged in the same manner as the first purge step S204. The inner atmosphere of the second process chamber 201b may be also exhausted through the first exhaust port 221 at the same time. When the inner atmosphere of the second process chamber 201b is also exhausted through the first exhaust port 221, the exhaust time can be shortened.

Transfer Pressure Adjusting Step S208

At a transfer pressure adjusting step S208 performed after the plasma generation step S405, the inner atmosphere of the second process chamber 201b or the transfer chamber 203 is exhausted through the second exhaust port 1481 such that the inner pressure of the second process chamber 201b or the transfer chamber 203 becomes a predetermined pressure (vacuum level). While the transfer pressure adjusting step S208 is performed or before or after the transfer pressure adjusting step S208 is performed, the wafer 200 may be supported by the lift pins 207 until the wafer 200 is cooled to a predetermined temperature. At the transfer pressure adjusting step S208, the inner pressure of the second process chamber 201b or the transfer chamber 203 may be exhausted through the first exhaust port 221 at the same time. When the inner atmosphere of the second process chamber 201b or the transfer chamber 203 is also exhausted through the first exhaust port 221, the exhaust time can be shortened.

Substrate Unloading Step S209

After the inner pressure of the second process chamber 201b is adjusted to a predetermined pressure at the transfer pressure adjusting step S208, the gate valve 1490 is opened, and the wafer 200 is unloaded to a vacuum transfer chamber (not illustrated) from the transfer chamber 203.

In the first embodiment, the silicon-containing film 403 is formed during the first process using aminosilane gas and DS gas as the first and second gases, respectively, the silicon/oxygen-containing film 404 is formed during the second process of oxidizing the silicon-containing film 403 using $O_2$ gas as the third gas, and the silicon/oxygen-containing film 404 is treated during the third process using $O_2$ gas as the third gas. However, the technique described herein is not limited to such an embodiment. For example, when a titanium nitride (TiN) film is formed, $TiCl_4$ may be used as the first gas, $NH_3$ may be used as the second gas, and $NH_3$ may be used as the third gas. When a silicon nitride (SiN) film is formed, aminosilane may be used as the first gas, $NH_3$ may be used as the second gas, and $NH_3$ may be used as the third gas. Furthermore, when a hafnium oxide (HfO) film is formed, $HfCl_4$ or TEMAH may be used as the first gas, $O_2$ may be used as the second gas, and $O_2$ may be used as the third gas.

In the first embodiment, when the treatment process is performed, a fourth gas may be supplied in addition to the third gas. For example, an oxygen-containing gas or $O_2$ gas may be used as the third gas, and a hydrogen-containing gas or $H_2$ gas may be used as the fourth gas. The addition of the hydrogen-containing gas may supply an element constituting a predetermined film while removing impurities such as Cl, C and N which are present in the film. For example, while Cl is removed, oxygen may be supplied. Specifically, $O_2$ gas is used as the third gas, and $H_2$ gas is used as the fourth gas.

Furthermore, the density of active species generated during the first process may be lower than the density of active species generated during the second process. That is, the density of active species generated during the second process may be higher than the density of active species generated during the first process. Since the first process is a cyclic process, the first process chamber 201a needs to have a small volume.

When the first process (film forming process) is performed and when the second process (oxidation process) is performed, the gas exhaust unit exhausts the atmosphere using the first exhaust port 221, and when the third process (treatment process) is performed, the gas exhaust unit exhausts the atmosphere using the second exhaust port 1481.

The first process chamber 201a may be used when the first process (film forming process) is performed. The second process chamber 201b is installed in the space under the first process chamber 201a, and used when the third process (treatment process) is performed.

When the third process is performed, the upper surface of the wafer 200 is disposed under the second electrode 344, and the side surface of the wafer 200 faces the quartz member 345 of the second electrode 344. When the upper surface of the wafer 200 is disposed under the second electrode 344, it is possible to reduce the amount of ion component reaching the wafer 200 among the active species generated through the second electrode 344. When the side of the wafer 200 faces the quartz member 345 of the second electrode 344, the gas exhaust passage 355 may be formed between the substrate placing table 212 and the quartz member 345, the treatment gas may be discharged from about the substrate placing table 212, and the processing uniformity of the treatment may be improved.

So far, the first embodiment has been described in detail. However, the technique described here is not limited to the first embodiment, but may be modified in various manners without departing from the scope thereof. Other embodiments of a technique described later will be described with reference to FIG. 9.

Other Embodiments

Figure 8:
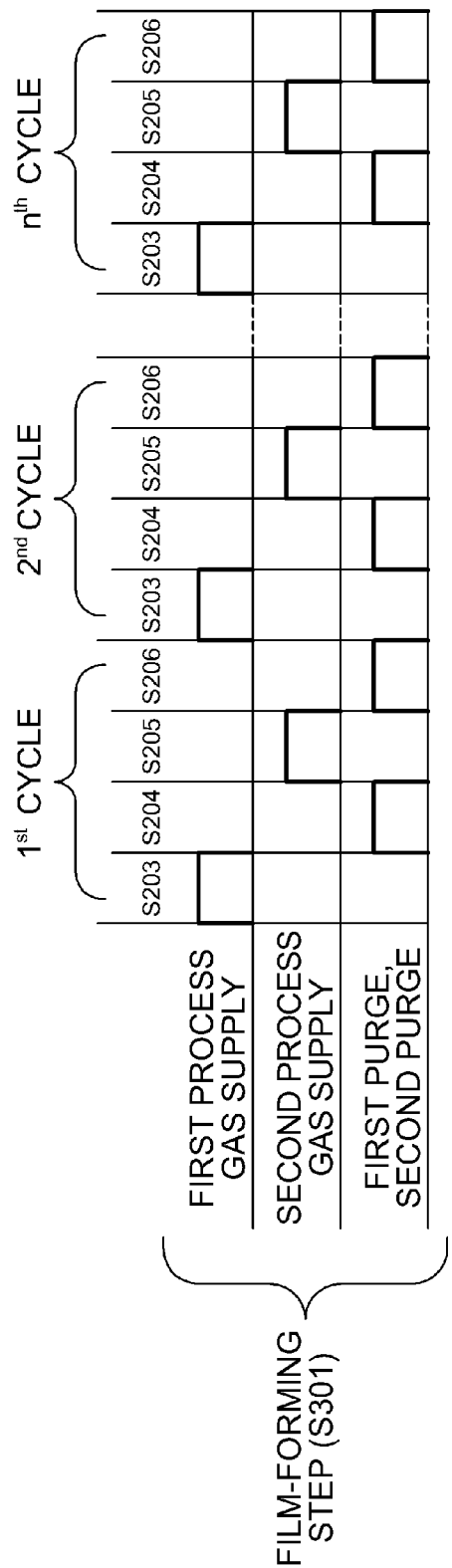
FIG. 8 is a flowchart exemplifying the sequence of the first process step according to the first embodiment described herein.
Figure 9:
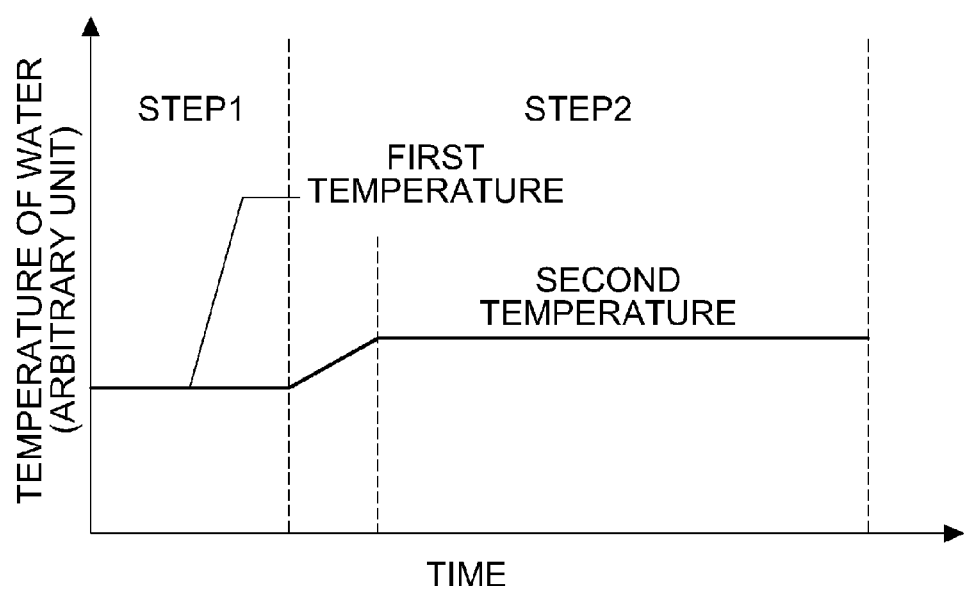
FIG. 9 is a diagram exemplifying temperature control of a first process step according to another embodiment described herein.

Carbon contained in the carbon-containing film 402 is desorbed during a process. Since the amount of desorbed carbon is proportional to temperature, the silicon-containing film 403 is preferably formed at low temperature. However, when the silicon-containing film 403 is formed at low temperature, the formation speed of the silicon-containing film 403 may be lowered. Thus, in order to increase the formation speed while suppressing desorption, the temperature of the wafer 200 may be changed at the first process step S301 as illustrated in FIG. 9. Referring to FIG. 9, the first process step S301 may include "step 1" and "step 2". The step 1 is to form a film at a temperature (first temperature) where desorption is suppressed until the surface layer 401 of the wafer 200 and the surface of the carbon-containing film 402 are formed, and the step 2 is to process the wafer 200 after the temperature is raised to a second temperature. At each of the first and second steps 1 and 2, the gas supply sequence illustrated in FIG. 8 is performed. Then, while the desorption of carbon from the carbon-containing film 402 is suppressed, a reduction in formation speed of the silicon-containing film can be suppressed. Even while the temperature is changed from the first temperature to the second temperature, the first and second processing gases may be supplied as a part of the step 2.

In the first embodiment described above, the first and second gases are alternately supplied to form a film. However, the technique described herein may be applied to other methods. The technique described herein may be applied even when timings at which the first and second gases are supplied overlap each other. The technique described herein may be applied to CVD (Chemical Vapor Deposition) or cyclic CVD. The CVD can reduce the number of steps included in the substrate processing process.

In the first embodiment described above, the first to third processes are performed by the same substrate processing apparatus. However, the technique described herein is not limited thereto. For example, the first to third processes may be performed by separate substrate processing apparatuses.

In the first embodiment described above, aminosilane gas is used as the first processing gas. However, the technique described herein is not limited thereto. For example, chlorosilane-based gases such as DCS, HCDS and MCS may be used as the first processing gas. The silane-based gas used as the first processing gas can suppress carbon from mixing with the silicon-containing film 403.

Furthermore, a silane source gas containing carbon (C), for example, a silane source gas containing a Si—C bond may be used as the first processing gas. The first processing gas may include gases such as 1, 1, 2, 2-tetrachloro-1, 2-dimethylsilane (($CH_3$)$_2Si_2Cl_4$, TCDMDS) gas and bis (trichlorosilyl)methane (($SiCl_3$)$_2CH_2$, BTCSM).

In the first embodiment described above, the first to third processes are performed in the same temperature zone. However, the technique described herein is not limited thereto. The temperatures at which the first to third processes are performed may be different from each other. For example, the temperature T1 during the first process, the temperature T2 during the second process and the temperature T3 during the third process may have the following relation.

I) T2<T1<T3

When the temperature T2 is lower than the temperatures T1 and T3, migration or thermal etching of silicon (Si) in the silicon-containing film 403 can be suppressed, which makes it possible to prevent a degradation in surface roughness of the final silicon oxide (SiO) film 405.

II) T1<T2<T3

When the temperature T2 is higher than the temperature T1 and lower than the temperature T3, the efficiency that carbon contained in the silicon-containing film 403 is removed can be improved.

In the first embodiment, the film forming process has been exemplified. However, the technique described herein may be applied to other processes. The technique described herein may be applied to other processes such as a diffusion process using plasma, an oxidation process, a nitridation process, an oxynitridation process, a reduction process, an oxidation reduction process, an etching process and a heating process. For example, the technique described herein may be applied when only a reactive gas is used to subject the surface of the substrate or a film formed on the substrate to a plasma oxidation process or plasma nitridation process. The technique described herein may be applied to a plasma annealing process using only a reactive gas. The technique described herein may be applied even when the above-described second process is then performed after the above-described processes are performed as the first process.

The first embodiment is applied to a process of manufacturing a semiconductor device. However, the technique described herein may be applied to other processes as well as the process of manufacturing a semiconductor device. Specifically, the technique described herein may be applied to a process of manufacturing a liquid crystal device, a process of manufacturing a solar battery, a process for manufacturing a light emitting device, and a substrate processing process such as a process of processing a glass substrate, a process of processing a ceramic substrate and a process of processing a conductive substrate.

The first embodiment exemplifies forming a silicon oxide film, but may also be applied even when other gases are used to form a film. The technique described herein may be applied even when an oxygen-containing film, a nitrogen-containing film, a carbon-containing film, a boron-containing film, a metal-containing film and combinations thereof are formed. Specifically, the technique described herein may be applied when forming films such as an aluminum oxide (AlO) film, a zirconium oxide (ZrO) film, a hafnium oxide (HfO) film, a hafnium aluminum oxide (HfAlO) film, a zirconium aluminum (ZrAlO) film, a silicon carbide (SiC) film, a silicon carbo-nitride (SiCN) film, a silicon boron nitride (SiBN) film, a titanium nitride (Tin) film, a titanium carbide (TiC) film and a titanium aluminum carbide (TiAlC) film.

In the first embodiment, the substrate processing apparatus which processes a sheet of substrate in one process chamber has been exemplified. However, the technique described herein is not limited thereto. The technique described herein may also be applied to an apparatus in which a plurality of substrates are arranged in a horizontal or vertical direction.

According to the technique described herein, the quality of an oxide film formed on a substrate can be improved.

What is claimed is:

1. A method of manufacturing a semiconductor device, comprising:
   (a) providing a substrate having a plurality of carbon-containing films protruding from a surface of the substrate;
   (b) forming a silicon-containing film on a surface of the plurality of carbon-containing films and a surface of the substrate by supplying a silicon-containing gas to the substrate;
   (c) forming a silicon/oxygen-containing film by supplying a first plasma of an oxygen-containing gas to the silicon-containing film to convert the silicon-containing film into the silicon/oxygen-containing film; and
   (d) forming a silicon oxide film by supplying a second plasma of the oxygen-containing gas to the silicon/oxygen-containing film to convert the silicon/oxygen-containing film into the silicon oxide film,
   wherein (b) comprises:
   (b-1) supplying the silicon-containing gas at a first temperature; and
   (b-2) supplying the silicon-containing gas at a second temperature higher than the first temperature after performing (b-1),
   wherein the first temperature is lower than a temperature such that carbon in the plurality of carbon-containing films is not separated from the plurality of carbon-containing films.

2. The method of claim 1, wherein an amount of an ion component of the second plasma is less than that of an ion component of the first plasma.

3. The method of claim 1, wherein the first plasma comprises capacitively coupled plasma and the second plasma comprises inductively coupled plasma.

4. The method of claim 2, wherein the first plasma comprises capacitively coupled plasma and the second plasma comprises inductively coupled plasma.

5. The method of claim 1, wherein (b) and (c) are performed in a first process chamber, and (d) is performed in a second process chamber in communication with the first process chamber after transferring the substrate to the second process chamber after performing (c).

6. The method of claim 2, wherein (b) and (c) are performed in a first process chamber, and (d) is performed in a second process chamber in communication with the first process chamber after transferring the substrate to the second process chamber after performing (c).

7. The method of claim 4, wherein (b) and (c) are performed in a first process chamber, and (d) is performed in a second process chamber in communication with the first process chamber after transferring the substrate to the second process chamber after performing (c).

* * * * *